United States Patent
Yamazaki (10) Patent No.: US 7,465,637 B2
(45) Date of Patent: Dec. 16, 2008

(54) METHOD FOR MANUFACTURING SEMICONDUCTOR DEVICE

(75) Inventor: Yasushi Yamazaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 132 days.

(21) Appl. No.: 11/520,696

(22) Filed: Sep. 14, 2006

(65) Prior Publication Data

US 2007/0072375 A1    Mar. 29, 2007

(30) Foreign Application Priority Data

Sep. 14, 2005  (JP) .............................. 2005-266597

(51) Int. Cl.
    *H01L 21/336* (2006.01)
(52) U.S. Cl. ..................................... 438/306
(58) Field of Classification Search .................. 438/297, 438/306; 257/302
    See application file for complete search history.

(56) References Cited

U.S. PATENT DOCUMENTS 5,365,097 A * 11/1994 Kenney ....................... 257/302

7,060,574 B2 * 6/2006 Kim et al. .................... 438/297

FOREIGN PATENT DOCUMENTS

| JP | 5-102479 A | 4/1993 |
|----|------------|--------|
| JP | 8-23092 A | 1/1996 |
| JP | 2000-114517 A | 4/2000 |
| JP | 2002-329795 | 11/2002 |

\* cited by examiner

*Primary Examiner*—Evan Pert
(74) *Attorney, Agent, or Firm*—McDermott Will & Emery LLP (57) ABSTRACT

A method for manufacturing a semiconductor device comprises the steps of forming a gate trench in a semiconductor substrate, forming a gate insulation film in an inner wall of the gate trench, filling a gate electrode material into at least an inside of the gate trench, forming a gate electrode by patterning the gate electrode material, and selectively forming a punch-through stopper region prior to patterning the gate electrode material, using a mask in a prescribed position of the semiconductor substrate that is adjacent to the gate trench. The step for forming the punch-through stopper region may be performed subsequent to the step for filling the gate electrode material into the gate trench, or may be performed prior to the step for forming the gate trench.

19 Claims, 11 Drawing Sheets

METHOD FOR MANUFACTURING SEMICONDUCTOR DEVICE

TECHNICAL FIELD

The present invention relates to a method for manufacturing a semiconductor device, and particularly relates to a method for manufacturing a semiconductor device that is formed using a transistor having an asymmetrically structured source/drain region.

BACKGROUND OF THE INVENTION

The recent miniaturization of DRAM (Dynamic Random Access Memory) cells has been accompanied by the necessity of shortening the gate length of access transistors (hereinafter referred to as cell transistors) in cell arrays. However, short channel effects in a transistor become more severe as the gate length is shortened, and drawbacks occur whereby the threshold voltage (Vt) of the transistor is reduced by increased sub-threshold current. When the impurity concentration in the substrate is increased in order to minimize the decrease in Vt, deterioration of the refresh characteristics in the DRAM becomes a severe drawback because of increased junction leakage.

Making the source/drain region of a cell transistor asymmetrical (asymmetric transistor) is known as one method for enhancing refresh characteristics in DRAM. This method involves restricting the spread of a depletion layer and preventing punch-through by making the concentration of an N-type impurity in the source/drain region on the bit line side higher than the concentration thereof in the source/drain region on the storage node side, and selectively forming a highly concentrated P-type impurity region below the source/drain region on the bit line side (see Japanese Patent Application Laid-open No. H05-102479). Maintaining a low impurity concentration in the substrate also makes it possible to minimize junction leakage in the source/drain region on the storage node side.

In this type of asymmetric transistor structure, after first forming a gate electrode on a P-type silicon substrate by a publicly known method, the region in which the source/drain region is to be formed on the storage node side is masked with a photo-resist, and a high-density P-type diffusion layer is formed by ion implantation of boron (B) deeper than the source/drain region, after which arsenic (As) is ion implanted to form a high-density N-type diffusion layer above the high-density P-type diffusion layer. A so-called punch-through stopper region is thereby formed. This region is composed of a high-density P-type diffusion layer that is below and adjacent to a source/drain region composed of a high-density N-type diffusion layer on the bit line side. The photo-resist is then completely removed, and phosphorus (P) is ion implanted on the entire surface of a P-type silicon substrate using the gate electrode as a mask, whereby a source/drain region on the storage node side is formed. This region is composed of a low-density N-type diffusion layer.

Figure 12:
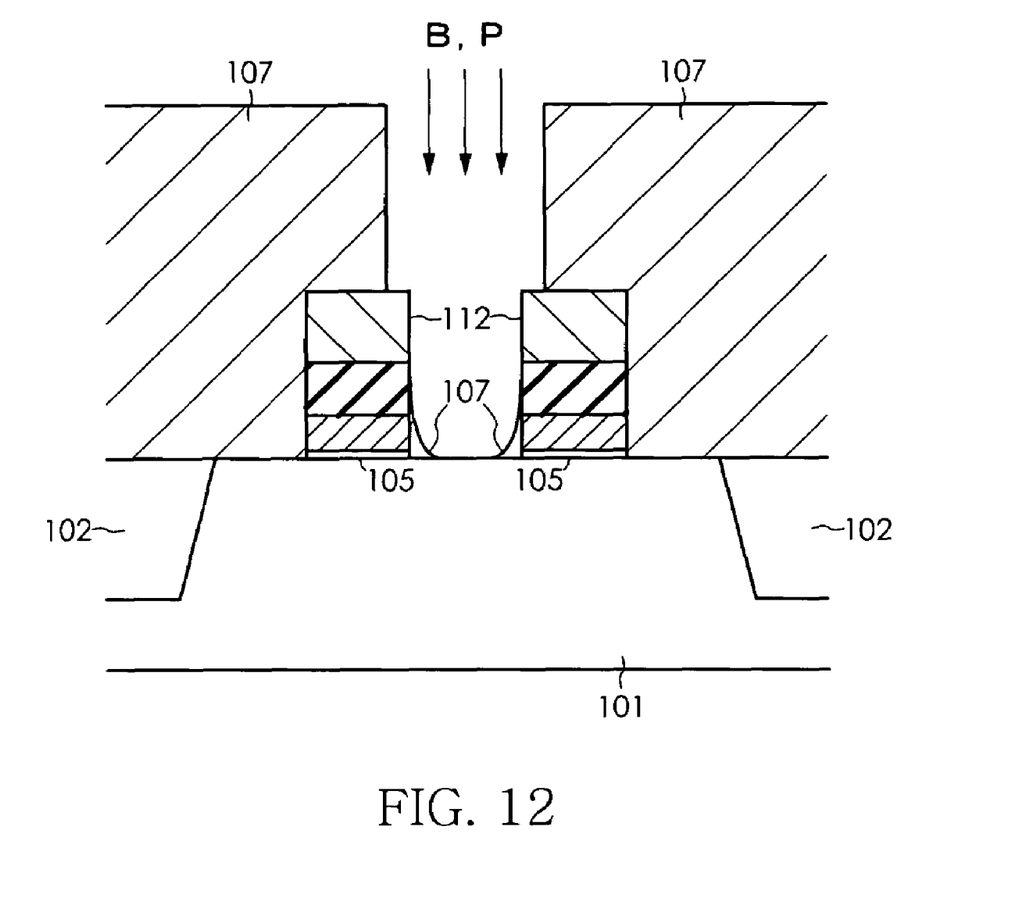
FIG. 12. is a schematic cross sectional view showing part of the process for manufacturing DRAM according to the prior art.

As described above, in order to form a source/drain region that has an asymmetric structure, a source/drain region must be formed using a photo-resist as a mask. However, since the aspect ratio of the space between gate electrodes has increased in conjunction with recent advances in pattern miniaturization and reduced transistor gate length, drawbacks are created by the photo-resist 107 remaining after photolithography, as shown in FIG. 12. In particular, the aspect ratio is further increased by polymetal gates and other multilayer structures such as those involving the gate electrodes 112, and photo-resist residues are a severe drawback. The photo-resist 107 acts as a mask for ion implantation when forming the high-density N-type diffusion layer (source/drain region on bit line side) and high-density P-type diffusion layer (punch-through stopper region) of an asymmetric transistor. It is therefore impossible to perform ion implantation with high precision in the prescribed profile when the photo-resist 107 forms a residue in this manner.

SUMMARY OF THE INVENTION

An object of the present invention is therefore to overcome the drawback of photo-resist residue, and to provide a method for manufacturing a semiconductor device whereby ion implantation can be performed with high precision in the desired profile in a prescribed region in which a source/drain region having an asymmetric structure is to be formed.

The above and other objects of the present invention can be accomplished by a method for manufacturing a semiconductor device, comprising the steps of forming a gate trench in a semiconductor substrate, forming a gate insulation film in an inner wall of the gate trench, filling a gate electrode material into at least an inside of the gate trench, forming a gate electrode by patterning the gate electrode material, and selectively forming a punch-through stopper region prior to patterning the gate electrode material, using a mask in a prescribed position of the semiconductor substrate that is adjacent to the gate trench.

In the present invention, the step for forming the punch-through stopper region may be performed subsequent to the step for filling the gate electrode material into the gate trench, or may be performed prior to the step for forming the gate trench. When these steps are performed in the former sequence, ion implantation is performed after the gate insulation film is formed, and a characteristic feature is therefore obtained in which the profiles of the high-density N-type diffusion layer and the high-density P-type diffusion layer are less likely to fluctuate. When these steps are performed in the latter sequence, there is no polysilicon film, for example, or other gate electrode material present to act as a through-film, making it possible to perform ion implantation at a low energy and to control the profile with ease.

According to the present invention, the boundary of the gate trench is utilized to form the source/drain region on the bit line side in self-aligning fashion, and the width of the opening in the photo-resist can therefore be set so as to be wider than the source/drain region on the bit line side. As a result, it is possible to adequately reduce fluctuation of the impurity concentration of the source/drain region on the bit line side that is caused by resist residue, and to significantly reduce fluctuation of the transistor characteristics due to misalignment of the gate electrode.

In a preferred aspect of the present invention, the method for manufacturing a semiconductor device further comprises a step for forming a first source/drain region above the punch-through stopper region using the mask used to form the punch-through stopper region.

In a preferred aspect of the present invention, the method for manufacturing a semiconductor device further comprises a step for forming a second source/drain region on an opposite side from the first source/drain region as viewed from the gate trench.

In a preferred aspect of the present invention, the first source/drain region has a higher impurity concentration than the second source/drain region.

In a preferred aspect of the present invention, the first source/drain region is connected to a bit line, and the second source/drain region is connected to a cell capacitor.

In a preferred aspect of the present invention, the gate electrode material comprises a multilayer film in the step for filling the gate electrode material into a gate trench. The multilayer film preferably comprises a first conducting film formed in at least the gate trench, and a second conducting film formed above the gate trench. Furthermore, the first conducting film is preferably a silicon film, and the second conducting film is preferably a metal film or a refractory metal silicide film.

The above and other object of the present invention can also be accomplished by a method for manufacturing a semiconductor device comprising a first step for forming first and second gate trenches in a semiconductor substrate, a second step for forming a gate insulation film on inner wall surfaces of the first and second gate trenches, a third step for filling a gate electrode material into at least the first and second gate trenches, a fourth step for forming a gate electrode by patterning the gate electrode material, a fifth step for forming a mask that has an opening for exposing an area between a region where the first gate trench is formed and a region where the second gate trench is formed, a sixth step for selectively forming a punch-through stopper region by ion implantation of a first conductive impurity into the semiconductor substrate under the opening using the mask, a seventh step for selectively forming a first source/drain region that is shallower than the punch-through stopper region by ion implantation of a second conductive impurity into the semiconductor substrate under the opening using the mask, and an eighth step for selectively forming a second source/drain region by ion implantation of the second conductive impurity which has a lower impurity concentration than the first source/drain region, in a region on an opposite side from the first source/drain region as viewed from the first gate trench, and a region on an opposite side from the first source/drain region as viewed from the second gate trench, wherein the fifth through seventh steps are performed prior to the fourth step.

BRIEF DESCRIPTION OF THE DRAWINGS

The above and other objects, features and advantages of this invention will become more apparent by reference to the following detailed description of the invention taken in conjunction with the accompanying drawings, wherein.

DESCRIPTION OF THE PREFERRED EMBODIMENTS

Preferred embodiments of the present invention applied to a DRAM cell transistor will now be described in detail hereinafter with reference to the accompanying drawings.

FIGS. 1 through 8 are schematic cross sectional views or plan views showing the process for manufacturing DRAM according to a first embodiment of the present invention.

Figure 1A:
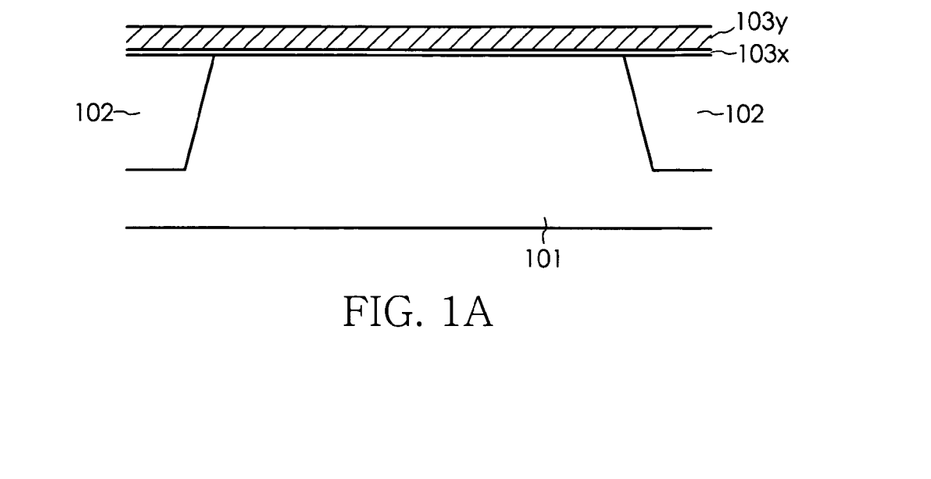
FIG. 1A to 1C are schematic cross sectional views showing the process for manufacturing DRAM (specifically forming a gate trench 104) according to a first embodiment of the present invention.
Figure 1B:
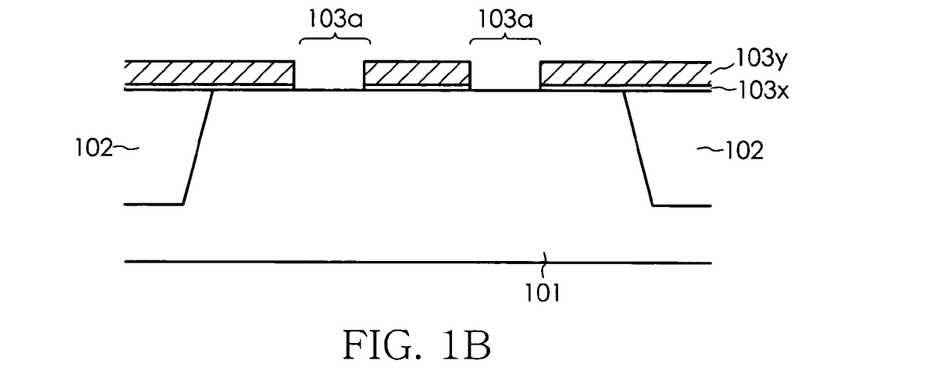
Figure 1C:
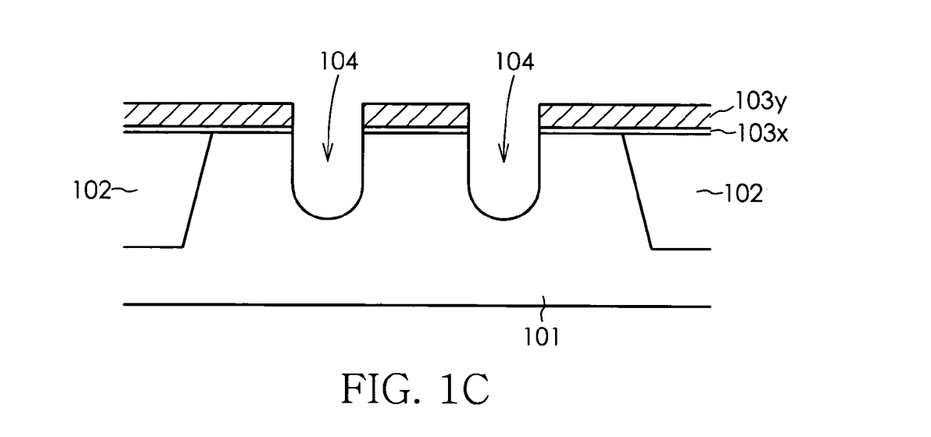

In the DRAM manufacturing process according to the present embodiment, an element separation region 102 having a depth of about 250 to 350 nm is first formed by an STI (Shallow Trench Isolation) method on a P-type silicon substrate 101, after which a silicon oxide film 103x having a thickness of about 10 to 20 nm and a silicon nitride film 103y having a thickness of about 100 to 200 nm as protective insulating films are sequentially deposited by a CVD method on the surface of the silicon substrate 101 as shown in FIG. 1A. An opening 103a is then formed by using a photolithography to selectively remove the silicon nitride film 103y and silicon oxide film 103x in the prescribed region in which the gate electrode is to be formed, as shown in FIG. 1B, and a mask pattern is formed for use in forming a gate trench. Two grooves (gate trenches) 104 spaced apart at a prescribed interval are then formed as shown in FIG. 1C by dry-etching the silicon substrate 101 using the mask pattern. The depth of the gate trenches 104 is preferably about 100 to 200 nm.

Figure 2:
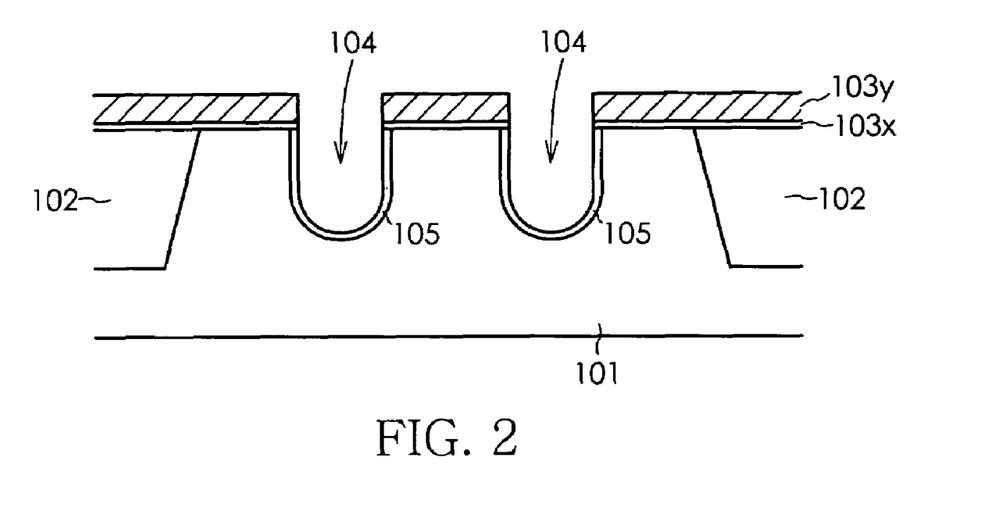
FIG. 2 is a schematic cross sectional view showing the process for manufacturing DRAM (Specifically forming a silicon oxide film 105) according to a first embodiment of the present invention.

As shown in FIG. 2, gate oxide films 105 having a thickness of about 6 to 8 nm are then selectively formed on the inner walls of the gate trenches 104 by thermal oxidation, with the silicon nitride film 103y and the silicon oxide film 103x remaining. The threshold voltage Vt of the transistor herein is preferably adjusted by the channel doping of the inside of the gate trenches 104 prior to the formation of the gate oxide films 105.

Figure 3:
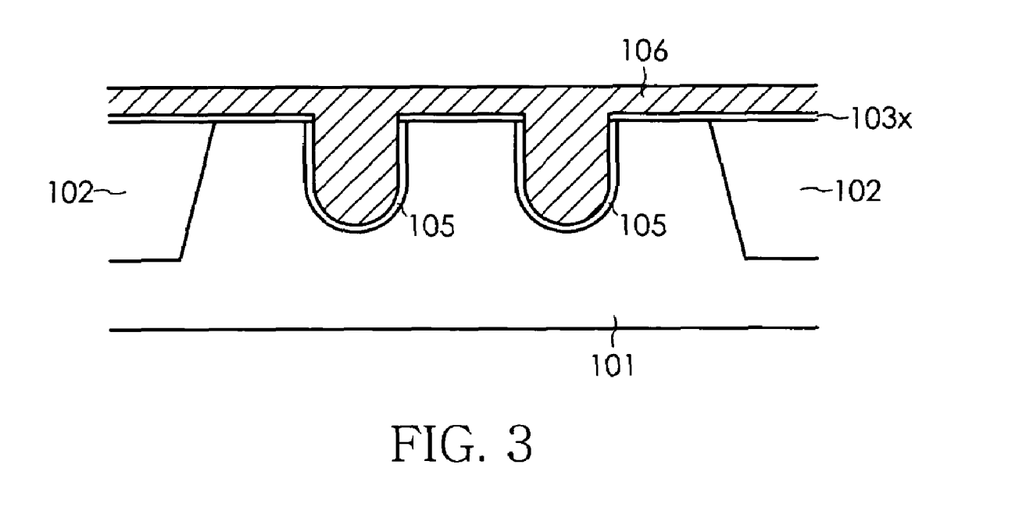
FIG. 3 is a schematic cross sectional view showing the process for manufacturing DRAM (Specifically forming a polysilicon film 106) according to a first embodiment of the present invention.

As shown in FIG. 3, after the silicon nitride film 103y is completely removed, a polysilicon film (doped polysilicon film) 106 that is doped with an N-type impurity and has a thickness of 50 to 100 nm is deposited by a CVD method onto the entire surface of the P-type silicon substrate 101, including the insides of the gate trenches 104.

Figure 4A:
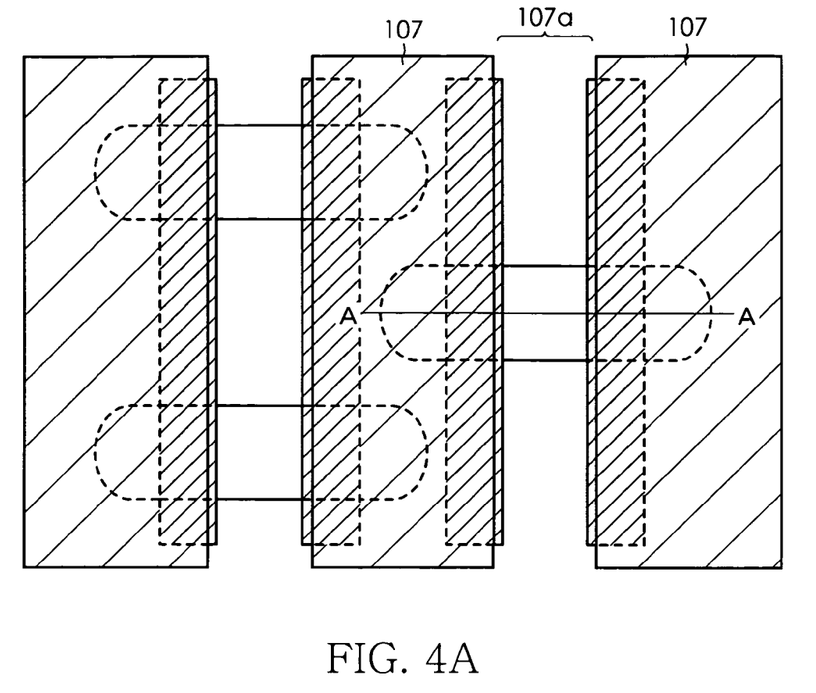
FIG. 4A is a schematic plan view showing the process for manufacturing DRAM (Specifically forming an opening 107a) according to a first embodiment of the present invention.
Figure 4B:
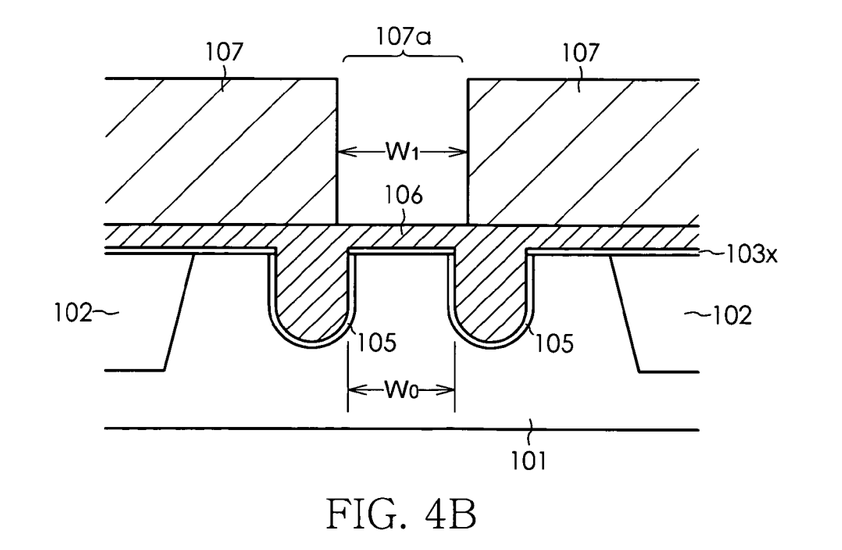
FIG. 4B is a schematic cross sectional view showing the process for manufacturing DRAM (Specifically forming an opening 107a) according to a first embodiment of the present invention.

After a photo-resist 107 is formed on the entire surface of the substrate, the photo-resist 107 in the region in which the bit-line-side source/drain region is to be formed is selectively removed to form an opening 107a, and a mask pattern for ion implantation is formed, as shown in FIGS. 4A and 4B. FIG. 4A is a schematic plan view showing the process for forming the photo-resist, and FIG. 4B is a cross sectional view along line A-A of FIG. 4A. As shown in the diagrams, the edges in the width direction of the opening 107a formed in the photo-resist 107 are positioned above the gate trenches 104, and the width $W_1$ of the opening 107a is set so as to be slightly larger than the width $W_0$ between the gate trenches 104.

Figure 5A:
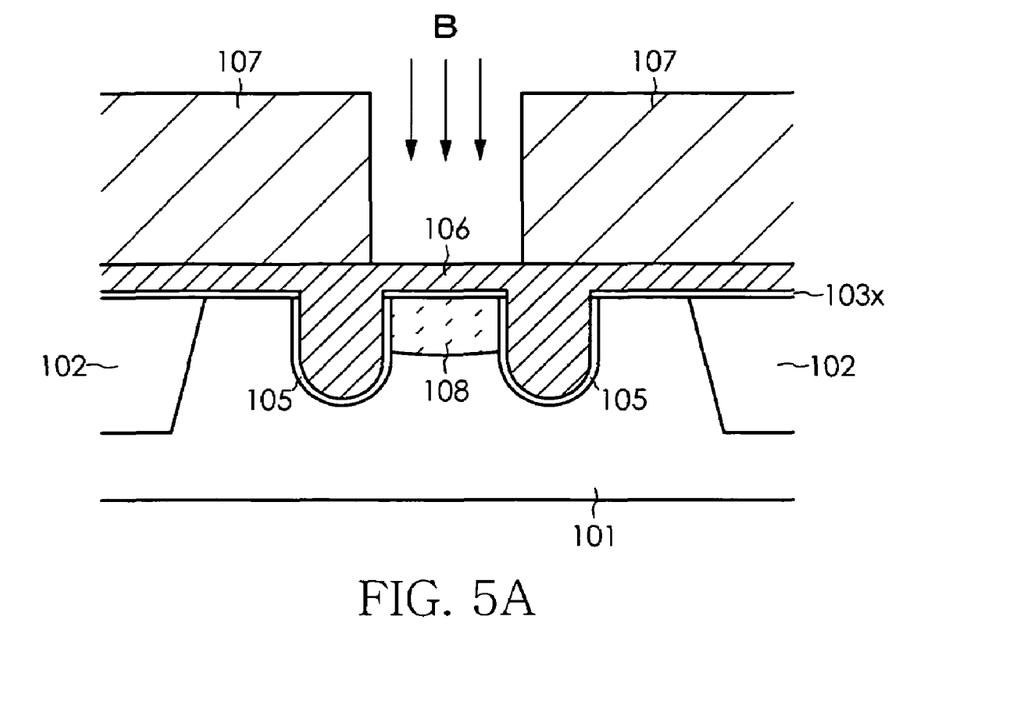
FIGS. 5A and 5B are schematic cross sectional views showing the process for manufacturing DRAM (Specifically forming a high-density P-type diffusion layer 108 and a high-density N-type diffusion layer 109) according to a first embodiment of the present invention.
Figure 5B:
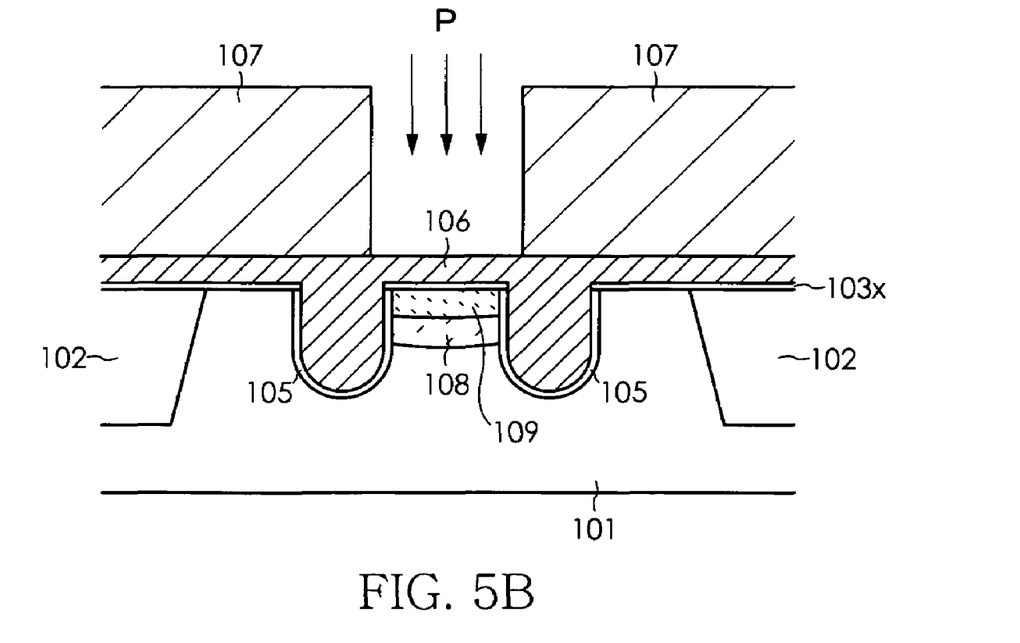

As shown in FIG. 5A, a high-density P-type diffusion layer 108 to be a punch-through stopper region is then formed by ion implantation of about $5 \times 10^{12}$ to $1 \times 10^{14}$ cm$^{-2}$ of boron (B) at an implantation energy of 20 to 70 keV into a prescribed region where the source/drain region of the bit line side is to be formed. A high-density N-type diffusion layer 109 to be the source/drain region (first source/drain region) on the bit line side is then formed above the high-density P-type diffusion layer 108 by ion implantation of about $1 \times 10^{13}$ to $1 \times 10^{15}$ cm$^{-2}$ of phosphorus (P) at an implantation energy of 40 to 100 keV, as shown in FIG. 5B. A high-density P-type diffusion layer 108 and a high-density N-type diffusion layer 109 are thus formed in self-aligning fashion using the gate trenches 104. Since the width $W_1$ of the opening 107a is slightly larger than the width $W_0$ between the gate trenches 104, boron (B) or phosphorus (P) is also implanted into the polysilicon film 106 in the gate trenches 104 during ion implantation. However, these impurities are not concentrated enough to have a significant effect on the electrical characteristics of the polysilicon film. When the width $W_1$ of the opening 107a is instead in the same manner as the width $W_0$ between the gate trenches 104, the high-density N-type diffusion layer 109 that is the source/drain region is separated from the gate oxide film 105 of one of the adjacent gate trenches when the position of the opening 107a is misaligned. Therefore, by making the width $W_1$ of the opening 107a larger than the width $W_0$ between the gate trenches 104 as described above, the high-density N-type diffusion layer 109 that is the source/drain region can be reliably placed in contact with the two gate oxide films in the gate trenches, even when the opening 107a is misaligned.

Figure 6A:
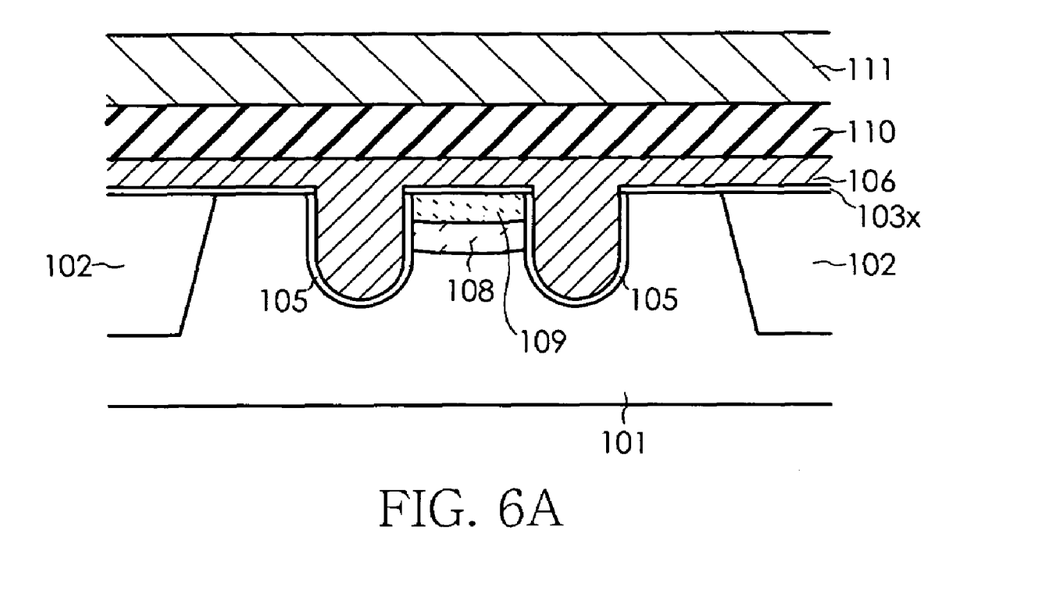
FIGS. 6A and 6B are schematic cross sectional views showing the process for manufacturing DRAM (Specifically forming a gate electrode 112) according to a first embodiment of the present invention.
Figure 6B:
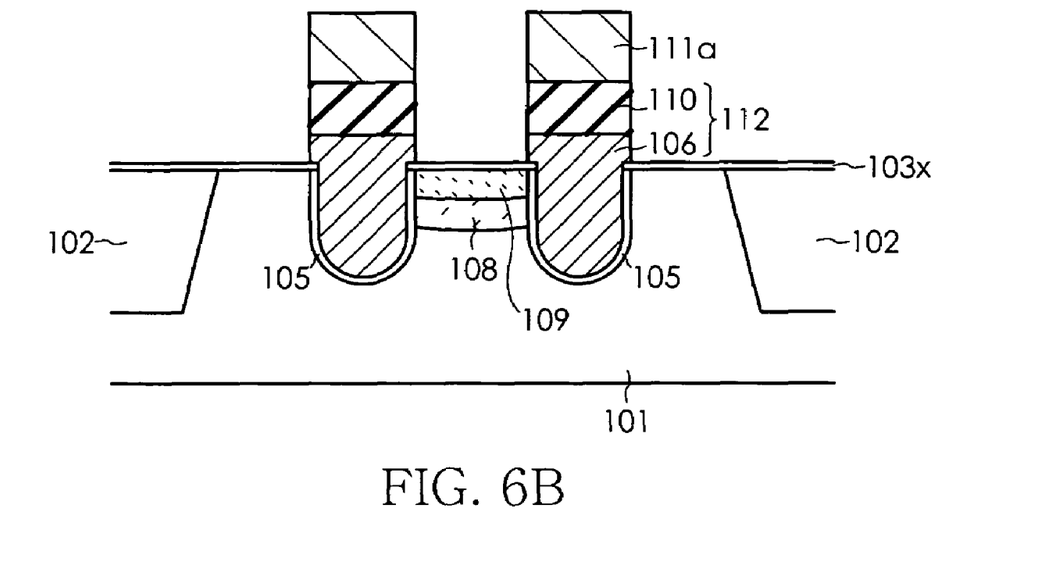

After the photo-resist 107 is completely removed, a refractory metal film 110 composed of tungsten (W) (preferably a multilayer film in which WN and W are deposited in this sequence), cobalt (Co), titanium (Ti), or nickel (Ni) is then deposited by sputtering on the surface of the polysilicon film 106, and a silicon nitride film 111 is furthermore deposited by CVD on the surface thereof, as shown in FIG. 6A. A photolithography is then used to form a pattern in the silicon nitride film 111, and a gate cap insulating film 111a having a thickness of about 20 nm is formed on the gate trench 104. The polysilicon film 106 and the refractory metal film 110 are then patterned using the gate cap insulating film 111a as a mask. The silicon oxide film 103x functions as an etching stopper at this time. A gate electrode 112 composed of the polysilicon film 106 and the refractory metal film 110 (also including the gate cap insulating film 111a in a broad sense) is thereby completed, as shown in FIG. 6B. A tungsten silicide (WSi) film or other refractory metal silicide film may also be formed instead of the refractory metal film 110.

Figure 7:
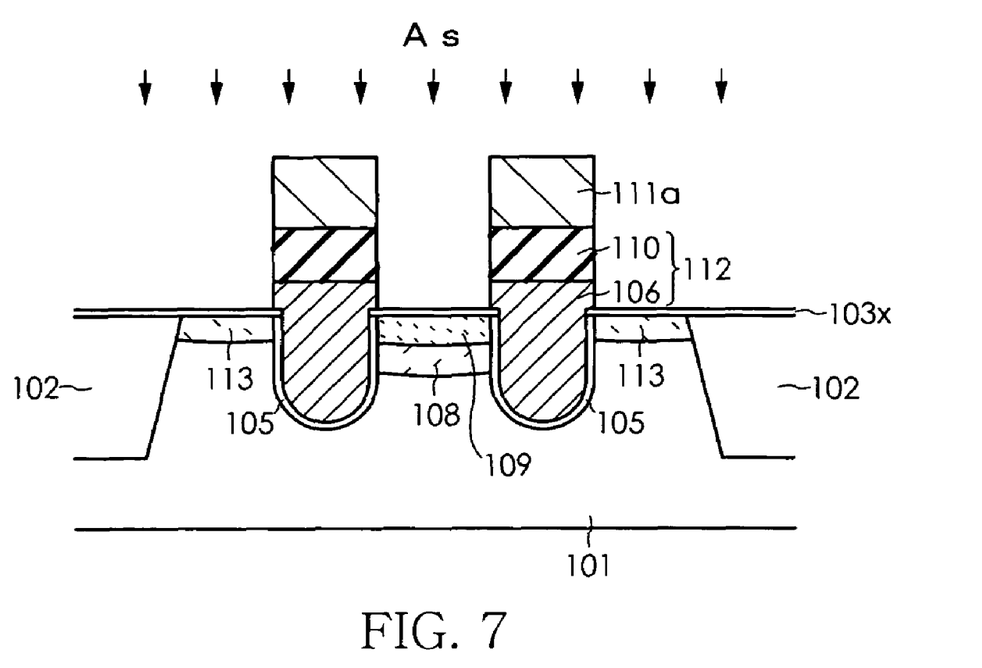
FIG. 7 is a schematic cross sectional view showing the process for manufacturing DRAM (Specifically forming a low-density N-type diffusion layer 113) according to a first embodiment of the present invention.

As shown in FIG. 7, a low-density N-type diffusion layer 113 is then formed in a position on the opposite side from the bit-line-side source/drain region as viewed from the gate electrode 112. The layer is formed by the ion implantation of about $5 \times 10^{12}$ to $1 \times 10^{14}$ cm$^{-2}$ of phosphorus (P) at an implantation energy of 10 to 50 keV into the entire surface of the substrate. A source/drain region (second source/drain region) on the storage node side is thereby formed in self-aligning fashion using the gate electrode 112.

A cell transistor having a trench-structured gate electrode and an asymmetrically structured source/drain region is thereby completed. Increasing the impurity concentration of the substrate in the source/drain region on the bit line side strengthens the electric field in that region, and junction leakage therefore also increases. In a DRAM, however, it is sufficient to merely reduce the junction leakage on the storage node side, and an increase in junction leakage on the bit line side is not a significant problem. In other words, punch-through can be suppressed instead of sacrificing the electric field of the source/drain region on the bit line side, and the DRAM refresh characteristics can be enhanced. Since endowing the gate electrode with a trench structure also increases the channel length, the refresh characteristics can be enhanced relative to those of a planar structure. However, the refresh characteristics can be dramatically enhanced by combining a trench structure for the gate electrode with an asymmetric structure for the source/drain region according to the present embodiment.

Figure 8:
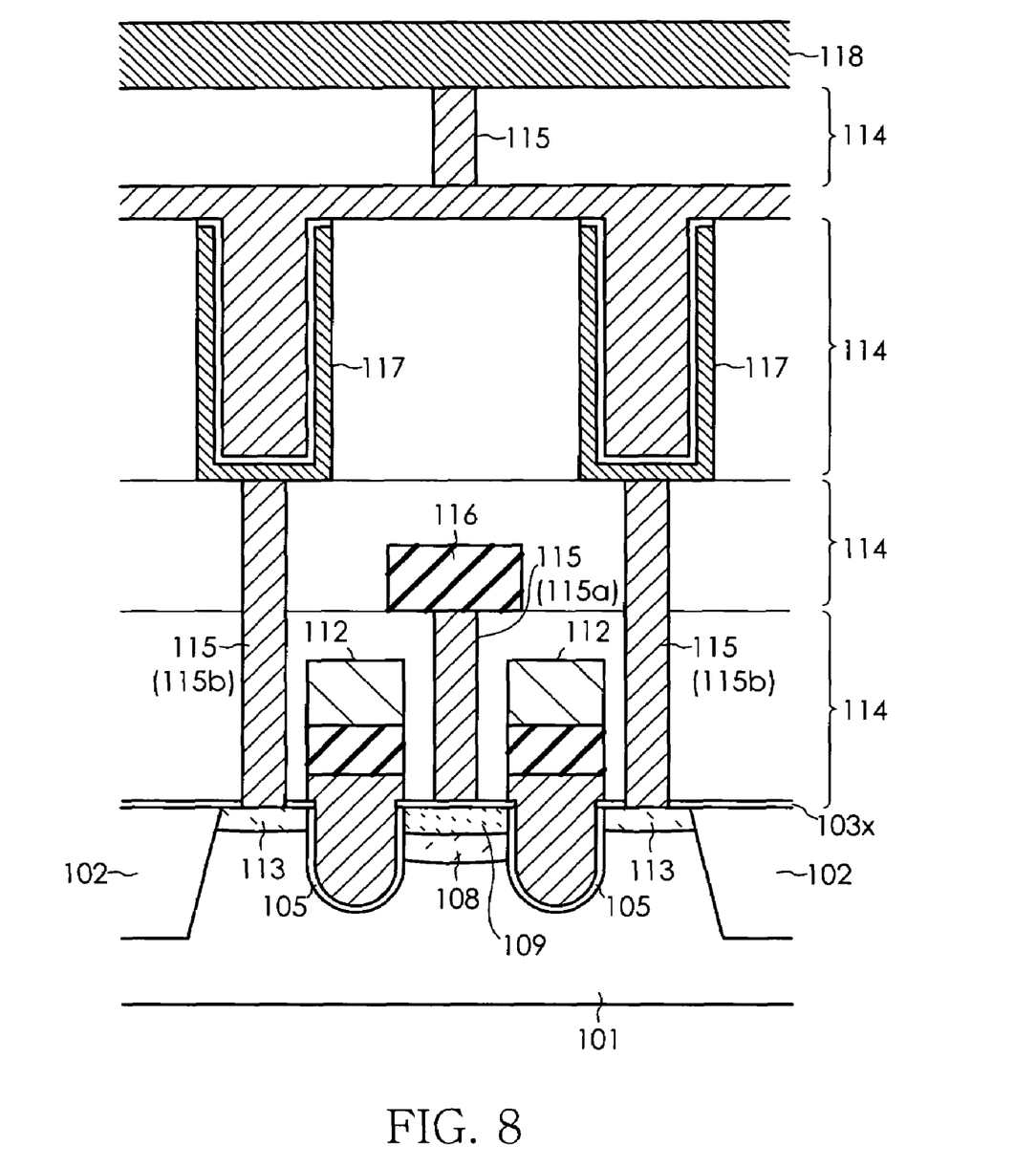
FIG. 8 is a schematic cross sectional view showing the process for manufacturing DRAM (Specifically forming various types of wiring and cell capacitors) according to a first embodiment of the present invention.

Various types of wiring and cell capacitors are then layered using a common DRAM manufacturing method. Specifically, DRAM having a trench-gate-type asymmetric cell transistor is formed by a process in which an interlayer insulating film 114 is formed on the cell transistor, followed by the formation of a bit line 116, a cell capacitor 117, wiring 118, a contact plug 115 (including a bit line contact 115a and a storage node contact 115b) that passes through the interlayer insulating film 114, and other components, as shown in FIG. 8.

As described above, the boundary of the gate trench is used to form the bit-line-side source/drain region in self-aligning fashion by performing a step for forming the source/drain region on the bit line side after performing the steps of forming a gate trench, forming a gate oxide film on the inner wall of the gate trench, and then embedding a polysilicon film on the entire surface of the substrate that includes the inside of the gate trench. It is therefore possible to adequately reduce fluctuation in the impurity concentration of the source/drain region on the bit line side caused by residual photo-resist, while preventing misalignment of the gate electrode. It is therefore possible to manufacture DRAM that has adequately reduced punch-through, little variation in transistor characteristics, and extremely good refresh characteristics.

Figure 9A:
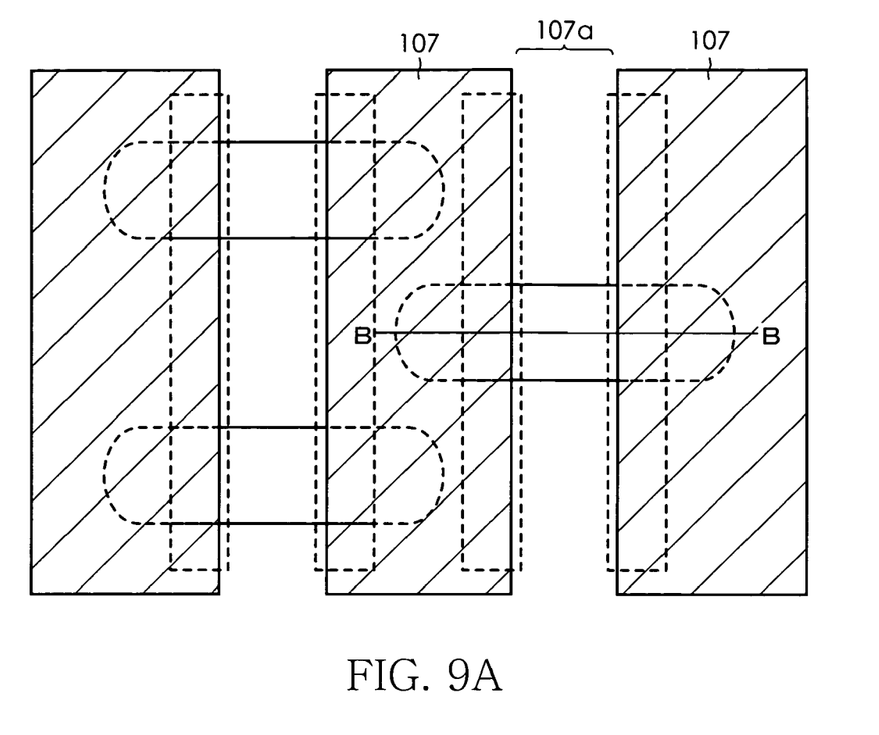
FIG. 9A is a schematic plan view showing part of the process for manufacturing DRAM (Specifically forming an opening 107a) according to a second embodiment of the present invention.
Figure 9B:
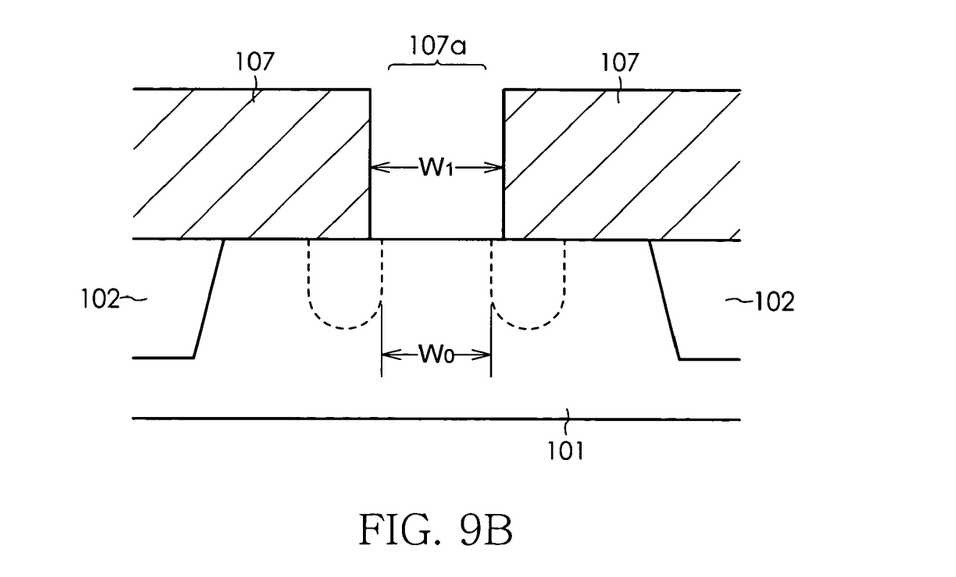
FIG. 9B is a schematic cross sectional view showing part of the process for manufacturing DRAM (Specifically forming an opening 107a) according to a second embodiment of the present invention.
Figure 10A:
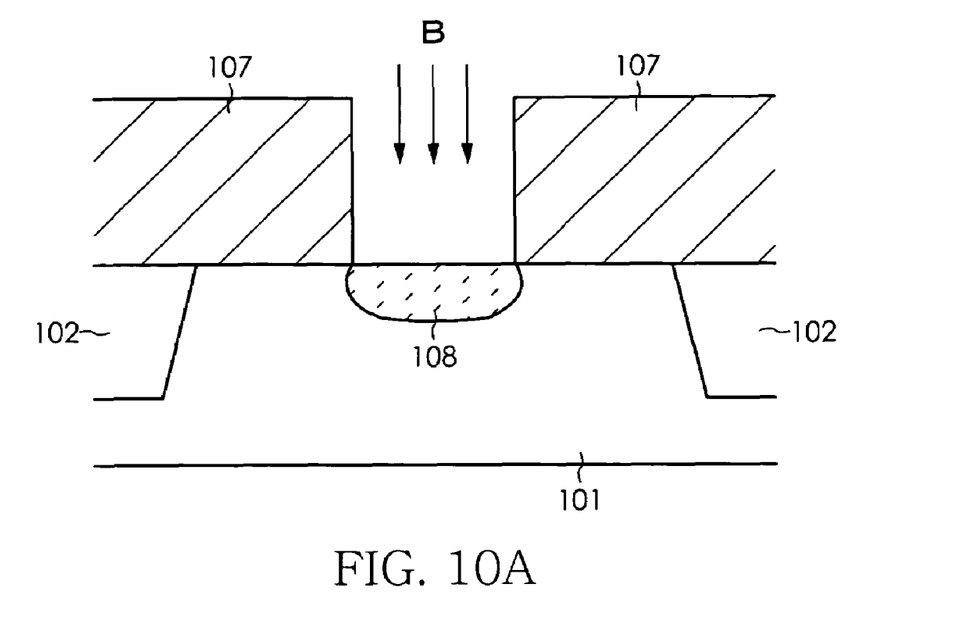
FIGS. 10A and 10B are schematic cross sectional views showing part of the process for manufacturing DRAM (Specifically forming a high-density P-type diffusion layer 108 and a high-density N-type diffusion layer 109) according to a second embodiment of the present invention.
Figure 10B:
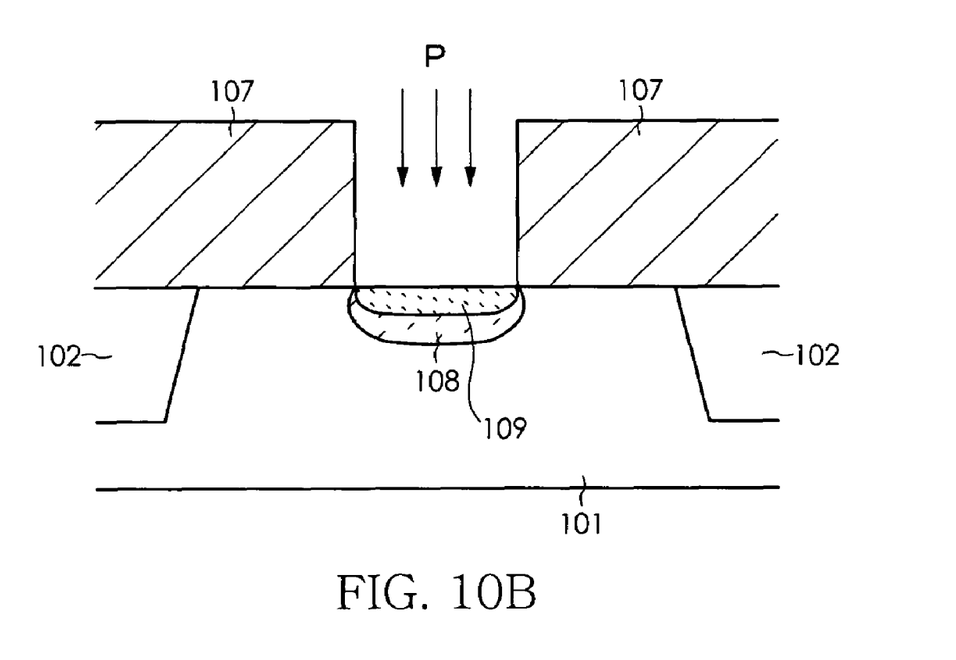
Figure 11A:
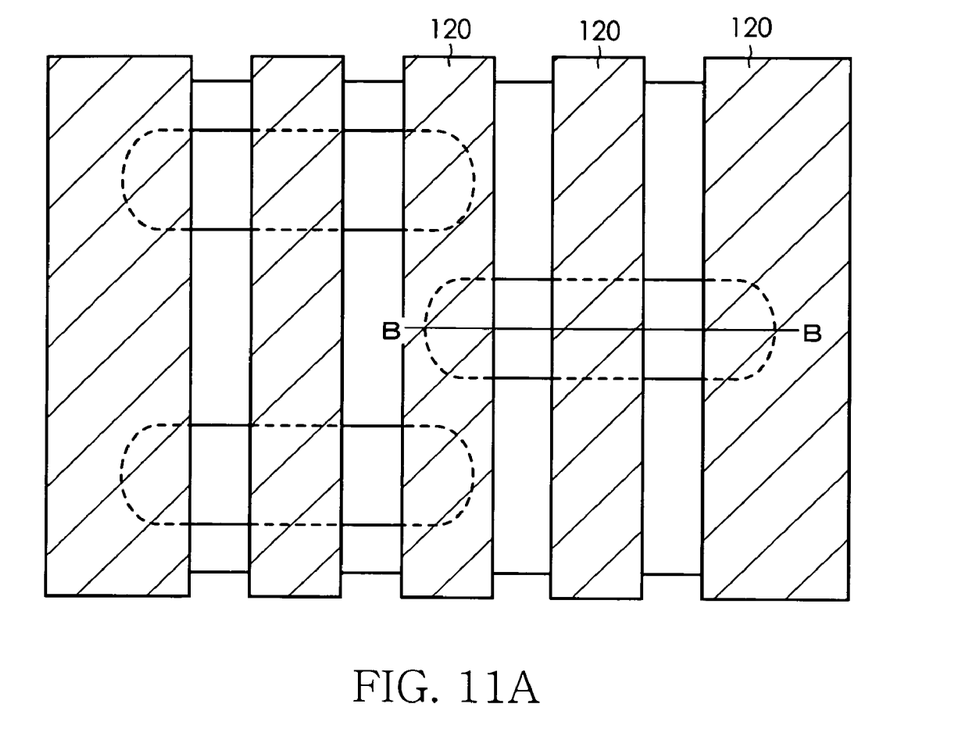
FIG. 11A is a schematic plan view showing part of the process for manufacturing DRAM (specifically forming a gate trench 104) according to a second embodiment of the present invention.
Figure 11B:
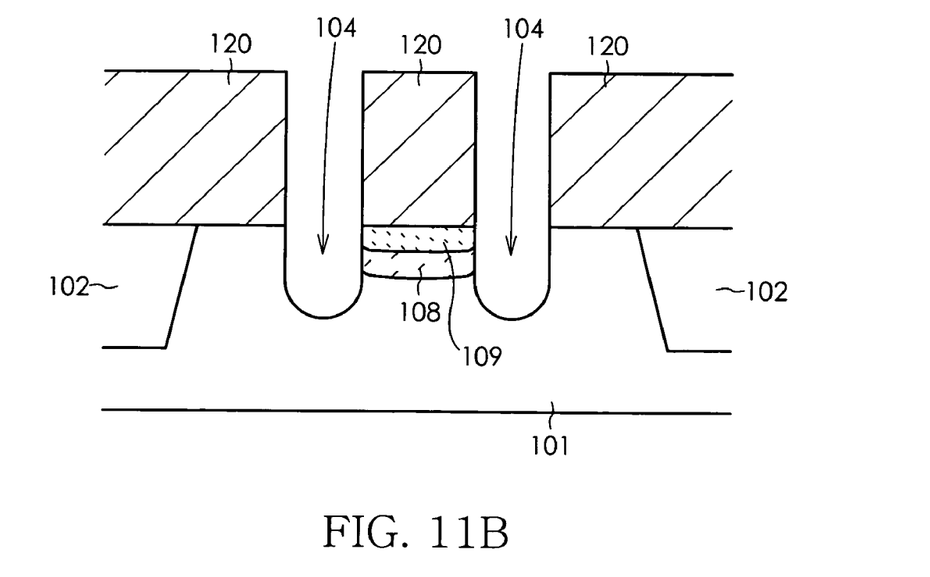
FIG. 11B is a schematic cross sectional view showing part of the process for manufacturing DRAM (specifically forming a gate trench 104) according to a second embodiment of the present invention.

FIGS. 9 through 11 are schematic cross sectional views and schematic plan views showing part of the process for manufacturing DRAM according to a second embodiment of the present invention.

A feature of the present embodiment is that ion implantation for forming the bit-line-side source/drain region is first performed on a P-type silicon substrate 101 in which an element separation region 102 is formed, and then a sequence of steps is performed that includes gate electrode formation and other processes.

The step for forming a source/drain region on the bit line side is substantially the same as in the first embodiment. After a photo-resist 107 is first formed on the entire surface of a P-type silicon substrate 101, the photo-resist in the region in which the bit-line-side source/drain region is to be formed is selectively removed to form an opening 107a, and a mask pattern for ion implantation is formed, as shown in FIGS. 9A and 9B. FIG. 9A is a schematic plan view showing the process for forming the photo-resist, and FIG. 9B is a cross sectional view along line B-B of FIG. 9A. As shown in the diagrams, the edges in the width direction of the opening 107a formed in the photo-resist 107 are positioned above the regions in which gate trenches 104 are to be formed, and the width $W_1$ of the opening 107a is set so as to be slightly larger than the width $W_0$ between the regions in which gate trenches 104 are to be formed.

As shown in FIG. 10A, a high-density P-type diffusion layer 108 to be a punch-through stopper region is then formed by ion implantation of about $5 \times 10^{12}$ to $1 \times 10^{14}$ cm$^{-2}$ of boron (B) at an implantation energy of 10 to 50 keV into a prescribed region where the source/drain region of the bit line side is to be formed. A high-density N-type diffusion layer 109 to be the source/drain region (first source/drain region) on the bit line side is then formed above the high-density P-type diffusion layer 108 by ion implantation of about $1 \times 10^{13}$ to $1 \times 10^{15}$ cm$^{-2}$ of phosphorus (P) at an implantation energy of 20 to 50 keV, as shown in FIG. 10B.

After the photo-resist 107 is completely removed, a new photo-resist 120 is formed on the entire surface of the substrate, the photo-resist 120 is selectively removed from the regions in which the gate trenches are to be formed, and a mask pattern is formed for use in forming the gate trenches, as shown in FIGS. 11A and 11B. Two gate trenches 104 spaced apart at a prescribed interval are then formed by dry etching the silicon substrate 101 using the aforementioned mask pattern. Since the width of the opening 107a is slightly larger than the width between the regions in which the gate trenches 104 are to be formed, boron (B) or phosphorus (P) is also implanted into the polysilicon film 106 during ion implantation in the regions in which the gate trenches 104 are to be formed. However, since these regions are removed by formation of the gate trenches 104, there is no effect on the characteristics of the gate electrode. Effects are thus obtained whereby the source/drain region on the bit line side is formed in self-aligning fashion with respect to the gate trenches.

The DRAM of the present embodiment is then completed by substantially the same process as the process shown in FIGS. 6 through 8. Specifically, as shown in FIG. 6, after gate oxide films 105 having a thickness of about 6 to 8 nm are selectively formed on the inner walls of the gate trenches 104, a polysilicon film (doped polysilicon film) 106 that is doped with an N-type impurity and has a thickness of 50 to 100 nm is deposited by a CVD method onto the entire surface of the P-type silicon substrate 101, including the insides of the gate trenches 104. A refractory metal film 110 composed of tungsten (W) or the like is then deposited by sputtering on the surface of the polysilicon film 106, and a silicon nitride film 111 is furthermore deposited by CVD on the surface thereof. A photolithography is then used to form a pattern in the silicon nitride film 111, and a gate cap insulating film 111a having a thickness of about 20 nm is formed on the gate trench 104. The polysilicon film 106 and the refractory metal film 110 are then patterned using the gate cap insulating film 111a as a mask. A gate electrode 112 composed of the polysilicon film 106 and the refractory metal film 110 (also including the gate cap insulating film 111a in a broad sense) is thereby completed, as shown in FIG. 6B.

As shown in FIG. 7, a low-density N-type diffusion layer 113 to be a source/drain region (second source/drain region) on the storage node side is then formed in a position on the opposite side from the bit-line-side source/drain region as viewed from the gate electrode 112. A cell transistor having a trench-structured gate electrode and an asymmetrically structured source/drain region is thereby completed. Furthermore, DRAM having a trench-gate-type asymmetric cell transistor is formed by a process in which an interlayer insulating film 114 is formed on the cell transistor, followed by the formation of a bit line 116, a cell capacitor 117, wiring 118, a contact plug 115 (including a bit line contact 115a and a storage node contact 115b) that passes through the interlayer insulating film 114, and other components, as shown in FIG. 8.

As described above, according to the present embodiment, the boundary of the gate trench is used to form the bit-line-side source/drain region in self-aligning fashion by sequentially performing various steps for forming the gate electrode after performing a step for forming the source/drain region on the bit line side. It is therefore possible to obtain the same effects as in the first embodiment. In other words, it is possible to adequately reduce the fluctuation in the impurity concentration of the source/drain region on the bit line side caused by residual photo-resist, while preventing misalignment of the gate electrode. It is therefore possible to manufacture DRAM that has adequately reduced punch-through, little variation in transistor characteristics, and extremely good refresh characteristics.

Several preferred embodiments of the present invention were described above, but the present invention is not limited by the abovementioned embodiments. The present invention may be modified in various ways in a range that does not depart from the intended scope thereof, and it is apparent that such modifications are encompassed by the claims of the present invention.

For example, in the first embodiment described above, gate oxide films 105 were formed with the silicon oxide film 103x and silicon nitride film 103y remaining, as shown in FIG. 2. However, the gate oxide films 105 may also be formed after the silicon nitride film 103y is removed.

A case was described in the abovementioned embodiments in which the element separation region is formed by an STI method, but this configuration is not limiting, and a LOCOS method or other method may of course be used.

Examples were also described in the abovementioned embodiments of a case in which the present invention is applied to an N-channel MOS transistor that uses a P-type silicon substrate, but the present invention is not limited to this configuration, and may also be applied to a P-channel MOS transistor. A P-well or an N-well may also be formed as needed. Furthermore, DRAM is used as an example of the semiconductor device in the abovementioned embodiments, but the present invention is not limited to this configuration, and can be applied to the manufacture of any semiconductor device that has an asymmetrically structured source/drain region and a trench-structured gate electrode. However, the present invention is highly effective in DRAM manufacture in terms of enabling significant enhancement of refresh characteristics.

What is claimed is:

1. A method for manufacturing a semiconductor device, comprising the steps of:
   forming a gate trench in a semiconductor substrate;
   forming a gate insulation film in an inner wall of the gate trench;
   filling a gate electrode material into at least an inside of the gate trench;
   selectively forming a punch-through stopper region, using a mask in a prescribed position of the semiconductor substrate that is adjacent to the gate trench;
   forming a first source/drain region above the punch-through stopper region using the mask used to form the punch-through stopper region;
   forming a gate electrode by patterning the gate electrode material subsequent to forming the punch-through stopper region and the first source/drain region; and
   forming a second source/drain region which has different impurity concentration from the first source/drain region on an opposite side from the first source/drain region as viewed from the gate trench subsequent to patterning the gate electrode material.

2. The method for manufacturing a semiconductor device as claimed in claim 1, wherein the step for forming a punch-through stopper region is performed subsequent to the step for filling the gate electrode material into a gate trench.

3. The method for manufacturing a semiconductor device as claimed in claim 1, wherein the step for forming a punch-through stopper region is performed prior to the step for forming a gate trench.

4. The method for manufacturing a semiconductor device as claimed in claim 3, wherein the first source/drain region has a higher impurity concentration than the second source/drain region.

5. The method for manufacturing a semiconductor device as claimed in claim 4, wherein the first source/drain region is connected to a bit line, and the second source/drain region is connected to a cell capacitor.

6. The method for manufacturing a semiconductor device as claimed in claim 5, wherein the gate electrode material comprises a multilayer film in the step for filling the gate electrode material into a gate trench.

7. The method for manufacturing a semiconductor device as claimed in claim 6, wherein the multilayer film comprises a first conducting film formed in at least the gate trench; and a second conducting film formed above the gate trench.

8. The method for manufacturing a semiconductor device as claimed in claim 7, wherein
   the first conducting film is a silicon film; and
   the second conducting film is a metal film or a refractory metal suicide film.

9. A method for manufacturing a semiconductor device, comprising:
   a first step for forming first and second gate trenches in a semiconductor substrate;
   a second step for forming a gate insulation film on inner wall surfaces of the first and second gate trenches;
   a third step for filling a gate electrode material into at least the first and second gate trenches;
   a fourth step for forming a mask that has an opening for exposing an area between a region where the first gate trench is formed and a region where the second gate trench is formed;
   a fifth step for selectively forming a punch-through stopper region by ion implantation of a first conductive impurity into the semiconductor substrate under the opening using the mask;
   a sixth step for selectively forming a first source/drain region that is shallower than the punch-through stopper region by ion implantation of a second conductive impurity into the semiconductor substrate under the opening using the mask;
   a seventh step for forming a gate electrode by patterning the gate electrode material; and
   an eighth step for selectively forming a second source/drain region by ion implantation of the second conductive impurity which has a lower impurity concentration than the first source/drain region, in a region on an opposite side from the first source/drain region as viewed from the first gate trench, and a region on an opposite side from the first source/drain region as viewed from the second gate trench; wherein
   the fourth through sixth steps are performed prior to the seventh step, and
   the eighth step is performed subsequent to the seventh step.

10. The method for manufacturing a semiconductor device as claimed in claim 9, wherein the fifth through seventh steps are performed subsequent to the third step.

11. The method for manufacturing a semiconductor device as claimed in claim 9, wherein the fifth through seventh steps are performed prior to the first step.

12. The method for manufacturing a semiconductor device as claimed in claim 11, wherein the opening of the mask also exposes a portion of the first and second gate trenches.

13. The method for manufacturing a semiconductor device as claimed in claim 12, wherein
   the gate electrode material comprises a multilayer film in which first and second conducting films are layered in sequence;
   the first conducting film is a silicon film; and
   the second conducting film is a metal film or a refractory metal silicide film.

14. The method for manufacturing a semiconductor device as claimed in claim 13, wherein
   the first source/drain region is connected to a bit line; and
   the second source/drain region is connected to a cell capacitor.

15. A method of manufacturing a semiconductor device comprising:
   selectively forming an isolation region in a semiconductor layer to define an element formation region of one conductivity type, the element formation region having first, second and third portions, the second portion being sandwiched between the first and third portions;
   forming a punch-through stopper region of the one conductivity type and one of source and drain regions of the other conductivity type in the first portion of the element formation region;
   forming the other of the source and drain regions of the other conductivity type in the third portion of the element formation region;
   removing the second portion to form a trench between the first and third portions of the element formation region;
   filling the trench with a gate material layer with an intervention of a gate insulating film therebetween, the gate material layer being elongated over the element formation region; and
   patterning the gate material layer to form a gate electrode, wherein
   the patterning the gate material layer is carried out between the forming a punch-through stopper region of the one conductivity type and one of source and drain regions of the other conductivity type, and the forming the other of the source and drain regions of the other conductivity type.

16. The method as claimed in claim 15, wherein the filling the trench with a gate material layer is carried out before the forming a punch-through stopper region of the one conductivity type and one of source and drain regions of the other conductivity type.

17. The method as claimed in claim 16, wherein the punch-through stopper region of the one conductivity type is formed before forming the one of source and drain regions of the other conductivity type doping.

18. The method as claimed in claim 15, wherein the removing the second portion to form a trench is carried out before the forming a punch-through stopper region of the one conductivity type and one of source and drain regions of the other conductivity type.

19. The method as claimed in claim 18, wherein the punch-through stopper region of the one conductivity type is formed before forming the one of source and drain regions of the other conductivity type doping.

* * * * *